United States Patent [19]

Agnello et al.

[11] Patent Number: 4,950,999

[45] Date of Patent: Aug. 21, 1990

[54] SELF-CONTAINED, REAL-TIME SPECTRUM ANALYZER

[76] Inventors: Anthony M. Agnello, 407 Prospect Ave., Princeton, N.J. 80504; Mark Clayton, Shore Dr., Box 541, Rd. 4, New Windsor, N.Y. 12550; Jon D. Paul, 2800 Third St., San Francisco, Calif. 94107

[21] Appl. No.: 319,341

[22] Filed: Mar. 6, 1989

[51] Int. Cl.$^5$ ............................................ G01R 23/16
[52] U.S. Cl. ................................ 324/77 B; 324/77 D; 370/69.1
[58] Field of Search .................. 324/77 R, 77 B, 77 C, 324/77 CS, 77 D, 77 E, 77 F, 77 G; 370/69.1, 120; 364/485; 128/663, 661.1

[56] References Cited

U.S. PATENT DOCUMENTS

| | | | |
|---|---|---|---|
| 4,410,970 | 10/1983 | Law ................................. | 324/77 D |
| 4,509,526 | 4/1985 | Barnes et al. .................... | 128/661.1 |
| 4,845,707 | 7/1989 | Isaacson et al. ................. | 370/69.1 |

Primary Examiner—Michael J. Tokar

[57] ABSTRACT

A self-contained, real-time spectrum analyzer performs the function of spectrum analysis on one or more analog electrical signals. The analyzer consists of an oversampling analog-to-digital converter 104, which converts the input signal 100 to digital form. The digital signal enters a digital signal processing integrated circuit microprocessor 108, which is operated by a stored program 112 that includes a spectrum analysis program 116. The output 122 of the digital signal processor 108 can be converted to analog signals by digital analog converters 124 for display on an external oscilloscope. A variable frequency oscillator 200 controls the sampling of the analog-to-digital converter 104, providing continuously variable analysis bandwidth. The output of the digital signal processor 108 can be applied to a display register and driver 300, which changes the output into a data format 302 suitable for use by a flat screen display 304. Visual output is presented to the user on a flat screen display 304, such as a liquid crystal display or electroluminescent display.

20 Claims, 3 Drawing Sheets

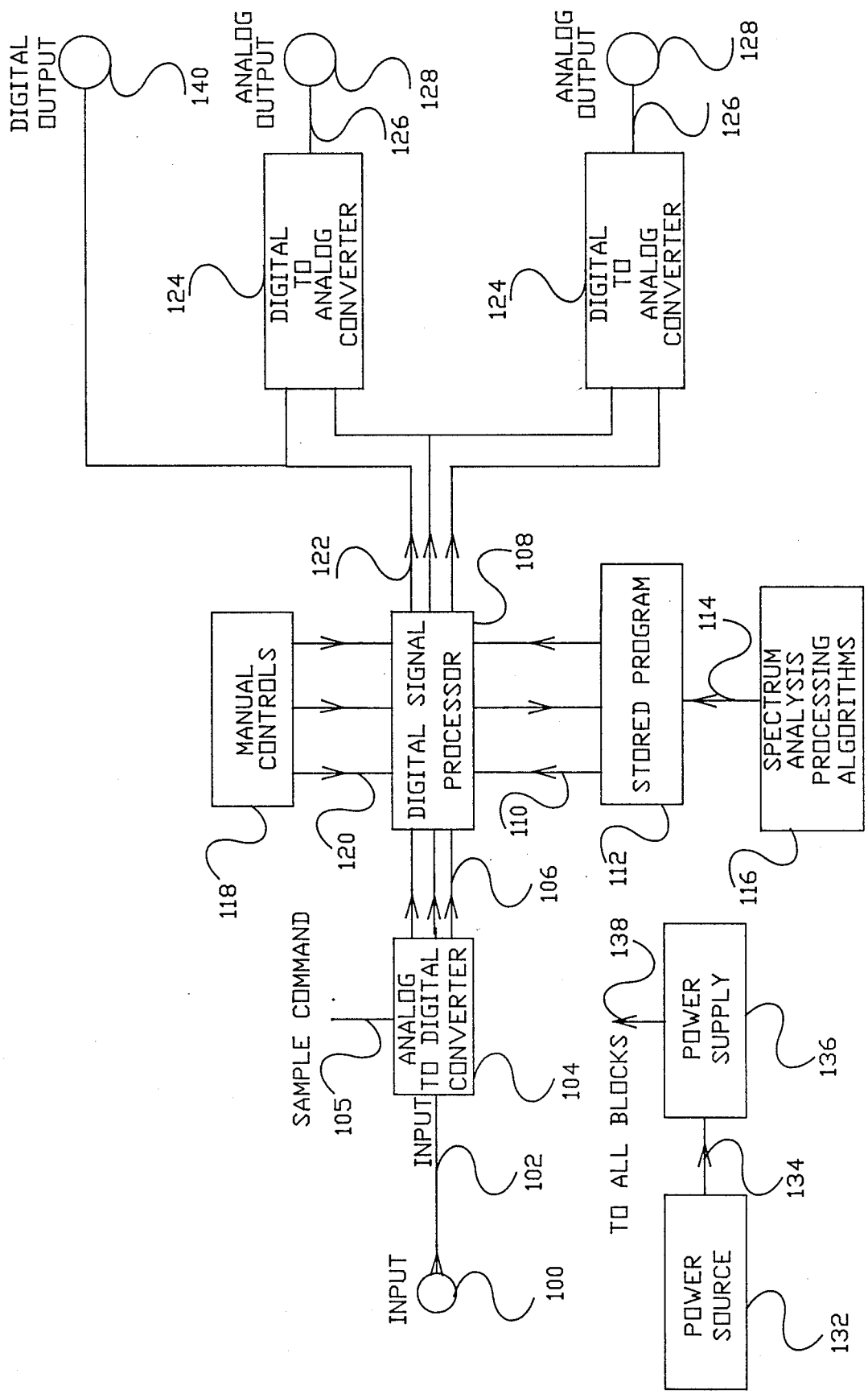
FIGURE NO. 1

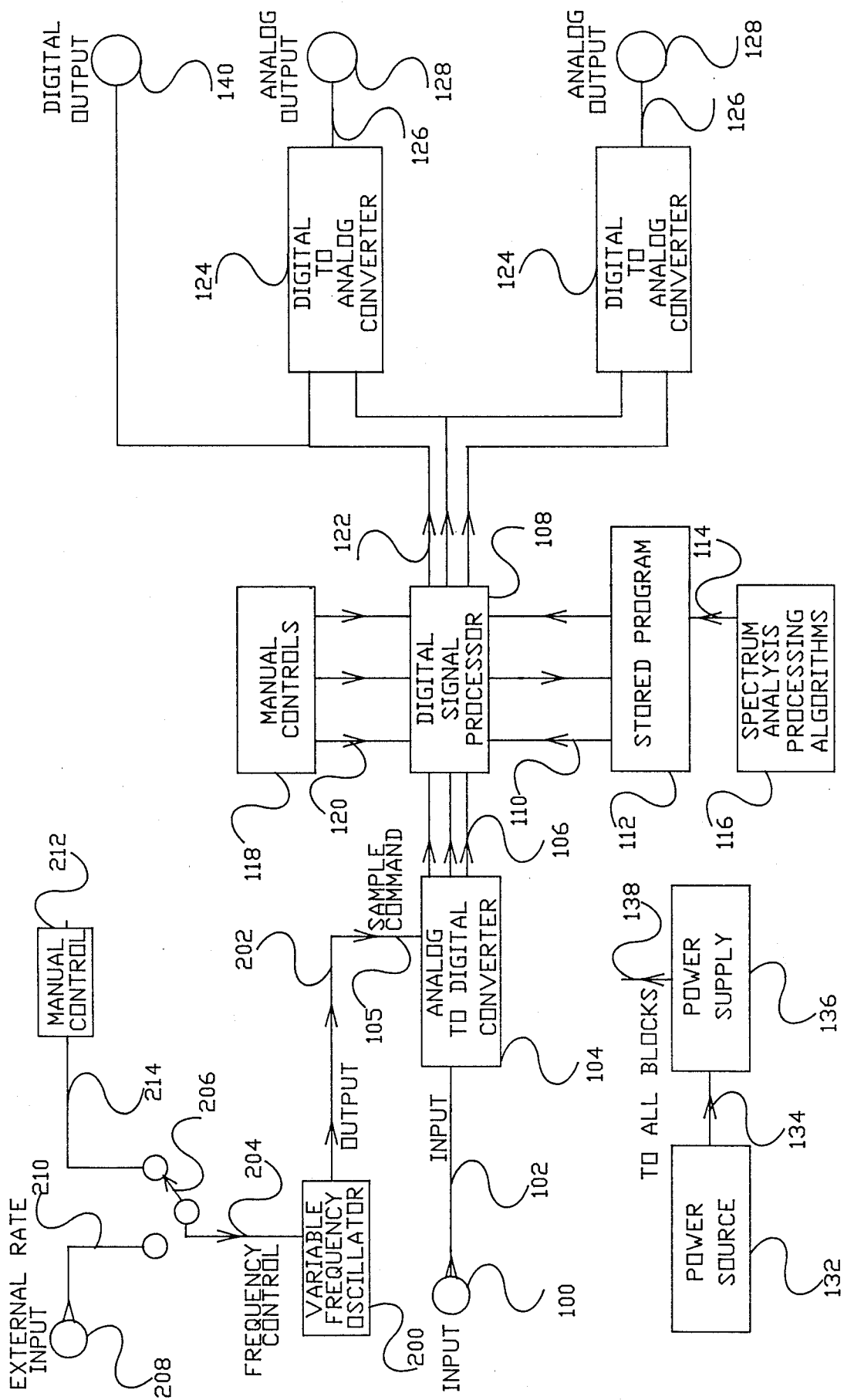
FIGURE NO. 2

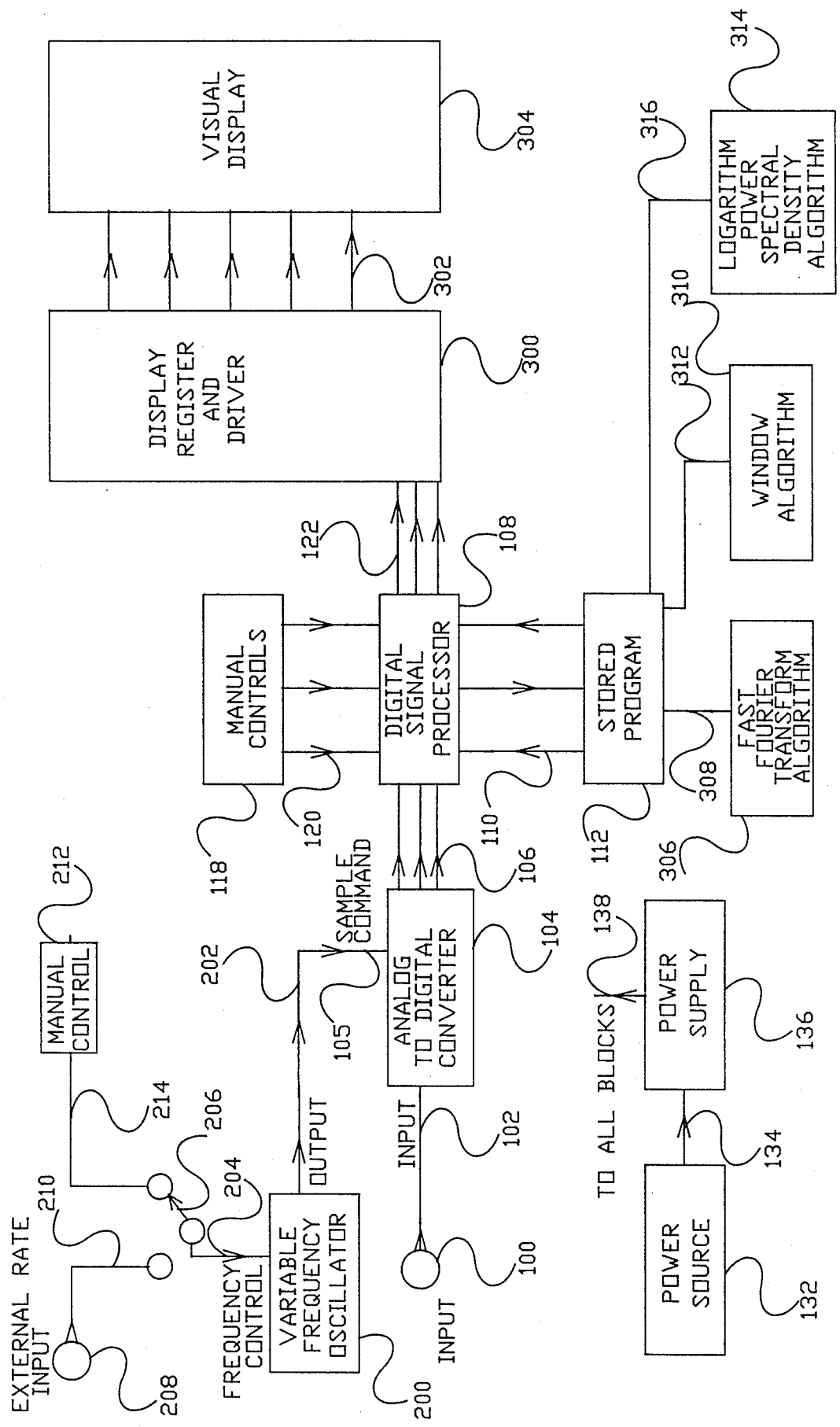
FIGURE NO. 3

SELF-CONTAINED, REAL-TIME SPECTRUM ANALYZER

BACKGROUND

1. Description of Prior Art

The usefulness of frequency spectrum analysis has long been known to the engineering community.

Electrical signals, such as speech, music, vibration, etc. coming from transducers, such as microphones and pick-ups, may be analyzed and examined by various techniques. Displaying these signals on an oscilloscope provides a represenation of amplitude versus time. It is very useful to obtain information about the frequency content of a signal. This may be done by using fixed frequency analyzers, such as filters attached to voltmeters and frequency selective voltmeters. However, these provide only a single point of frequecy information. The mathematics of spectrum analysis was worked out by the French mathematician Fourier, who proved that a periodic signal may be represented by a sum of sine waves, which include the fundamental and various harmonics. The amplitude of these harmonics represents a spectrum and may be graphically displayed to provide a visual indication of the frequency content of the signal, frequecy on one axis and amplitude on the other axis. The technique of spectrum analysis has been evolving over the years, becoming faster and more accurate. The earliest techniques took a sample of data, for example, a one second tape recording, and repeatedly analyzed it by mechanically or electrically moving a filter. The result would take many times the length of the sample to provide a complete set of data. For example, to analyze a 100 harmonic spectrum of data lasting one second, a moving filter analyzer would require 100 seconds. Obviously, if data is coming into the analyzer at a continuous rate, the operation of analysis takes so long that input data accumulates much faster than it can be analyzed. This is called a non real-time situation.

In most applications, it is critical that analysis be performed in real-time, that is, data is analzed as rapidly as it enters the system. A delay may be experienced between the input data and the output spectra, however, every piece of input data is being analyzed and outputted at the same rate. The techniques of real-time analysis have greatly benefited from computer technology and mathematical advances, such as the fast Fourier transform. The invention addresses itself to certain improvements in this field.

Early analog spectrum analysis techniques that generate a graph of amplitude versus frequency included moving filters, swept local oscillators, and multiple filter banks. All of these techniques suffer from a limited resolution on the frequency axis and poor dynamic range on the amplitude axis. Another limitation was their substantial size and weight. Over the years, such analyzers, which have occupied up to a cubic meter of volume, have been shrunk down in size but still are as big as a computer.

Some filter bank analyzers provide a constant percent bandwidth "third octave" analysis, which is very limited in frequency resolution. For the band from 20 Hz-20 kHz there are only 29 one-third octave bands.

In may applications, such as rotating machinery, vibration analysis, underwater sound, speech research, etc., much higher resolution is required. The fast-Fourier transform (FFT) technique has allowed computers to take over the function of analog filters and analog technique. The computing power required to do this is substantial and has, therefore, limited application of real-time spectrum analysis to bulky computers which are not portable and require substantial power. The prior art available high resolution, real-time analyzers required either a great sacrifice in dynamic range, bandwidth, resolution, etc., and are large, expensive, and difficult to use, oftentimes occupying an entire rack of equipment and costing from $10,000 to $30,000.

The prior art devices has a few fixed ranges for analysis bandwidth in a power of 2 sequence or a 1,2,5,10 progression. Each range needs additional filters and other hardware, increasing size and weight, as well as cost.

A spectrum analyzer using digital signal processing has a frequency range that is determined by the sample rate of the A/D converter. Changing this frequency range requires a corresponding change in the input anti-aliasing filter, which is used to limit the bandwidth of the input signal, according to the Nyquist criteria, as described in Mischa Schwartz, "Information Transmission, Modulation, and Noise," MaGraw Hill, 1959, p. 169-180, par. 4-5, 4-6. Prior art spectrum analyzers included a series of analog, switched capacitor, or other types of anti-aliasing filters for this purpose.

OBJECTS

It is accordingly an object of the invention to provide a self-contained, real-time spectrum analyzer capable of providing high-resolution frequency spectra of audio bandwidth analog signals.

Other objects are to provide such an analyzer in a self-contained, battery-operated, hand-held form.

Another object is to provide an analyzer whose analysis bandwidth and resolution are continuously variable over a range of frequencies through the manipulation of a single control.

Yet a further object is to provide such a variable frequency capability, which may be controlled manually or by an external input, such as that derived from a tachometer.

Another object is to provide a spectrum analyzer that includes a flat screen visual display in a hand-held package.

Yet another object is to provide such a spectrum analyzer with a digital output suitable for interfacing to a computer.

A further object is to provide a spectrum analyzer with wide dynamic range and high resolution.

Another object is to provide a spectrum analyzer whose power source and power supply are self-contained within its hand-held package.

A further object is to provide a spectrum analyzer whose analog-to-digital conversion process eliminates the need for a separate input anti-aliasing low-pass filter and a separate sample-and-hold circuit.

A further object is to provide analysis of a plurality of channels simultaneously.

Other objects and advantages are to provide an improved spectrum analyzer. Further objects and advantages will become apparent from a consideration of the ensuing description and accompanying drawings.

BRIEF DESCRIPTION OF THE DRAWINGS

FIG. 1 is a general block diagram of a self-contained real-time spectrum analyzer, in accordance with the invention.

FIG. 2 is a block diagram of the invention, including additional components for continuously variable resolution and bandwidth.

FIG. 3 is a block diagram of the invention, including additional components for a visual display and additional computer programs for fast-Fourier transform, windowing, and log power spectral density.

SUMMARY OF THE INVENTION

A miniature spectrum analyzer with real-time audio frequency capability is pocket size, self-contained, and battery operated. This device provides the capability of a hand held signal processing system for analyzing signals in the audio band. This function is extremely valuable in field use, for industrial, and military applications. The analyzer uses an oversampling analog-to-digital converter and a digital signal processing integrated circuit, in combination with fast Fourier transform, and other algorithms to compute frequency spectra in real-time. The output may be a display such as a liquid crystal or electroluminescent matrix display, or an analog electrical output may be provided for display on an external oscilloscope.

BACKGROUND OF THE INVENTION

The modern techniques for spectrum analysis use digital signal processing implement a fast Fourier transform algorithm. In this technique, the analog input signal to be analyzed is first sampled periodically and then converted into a sequence of digital words, which represent the analog signal at the sampled instants in time. These digital words are applied to a computer, which has the capability of performing mathematical operations on the digital words under control of a fast Fourier transform algorithm. This algorithm computes the Fourier coefficients of a set of sampled data and provides them as a sequence of digital words, which can be further processed or displayed.

The fast Fourier transform is a technique that was developed to increase the processing speed of the computations required to generate the Fourier transform of a series of time data. These techniques are well known to those in the art and have been employed for 20 years in the signal processing industry. See, for instance, "Digital Processing of Signals," by Bernard Gold and Charles M. Rader, McGraw Hill, 1969, Chapter 1 and Chapter 6.4, pp. 173–186. The advance of the integrated circuit art has allowed the entire digital signal processing computer to be inplemented on a single integrated circuit. The computational algorithms may be stored in a read only memory and the entire system can operate on signals in real-time. The input part of the system is the conversion from the analog to the digital domain.

The are many techniques for implementing the conversion from an analog input signal to the digital form. The simplest technique is the use of successive approximation or dual slope converters, which are techniques well known to those of skill in the data conversion art. These methods work for low speeds (below 3 kHz), low resolution (12 bits or less) but will be too noisy or slow to covert wide dynamic range audio signals (80–100 dB) at full (20 kHz) audio bandwidth.

In addition, these converter methods have excessive distortion, and power consumption. In addition, the input signal must be band limited through a low-pass filter and held constant during the conversion time by a separate sample-and-hold circuit prior to entering the A/D converter.

These problems have led to the search for better and faster conversion techniques, which obviate the need for these additional components in front of the converter. The preferred technique is to use an oversampling converter in which the input signal is applied to a low resolution (1–6 bits) very high speed A/D converter, sampling the input at say, 64–128 times the audio sampling frequency. This technique is described in: "A Stereo 16 Bit Delta-Sigma A/D Converter for Digital Audio", by D. R. Welland, B. P. Del Signore, B. J. Swanson, T. Tanaka, K. Hamashita, S. Hara, K. Takasuka; paper presented at 85th Convention of the Audio Engineering Society, Nov. 1988 and "Design and Implementation of an Audio 18-Bit Analog-to-Digital Converter Using Oversampling Techniques", by Robert W. Adams, Journal of the Audio Engineering Society, Vol. 34, No. 3, Mar. 1986.

It can be shown that all of the information required for an N bit conversion at a sampling frequency fs is obtained by oversampling at M times fs with a resolution of N minus $\log_2 M$. The decimation of the oversampled data to the audio frequency sampling rate is done in the digital domain by digital filtering, decimation, etc., as described in the references. A single integrated circuit can contain the high speed A/D, latch, decimator, digital filter, needed for a complete A/D converter.

There are several different topologies for this technique, including: feedback differential converters, Delta modulation, differential pulse code modulation, feedback pulse code modulation, and noise shaping. All of these techniques are similar and differ only in the position of input and feedback components, and in the number of bits in the high speed oversampling converter. The output of these types of converters is linear pulse code modulation, and practical implementations can yield 16 or more bits for resolution.

The successive approximation and dual slope A/D techniques require an input anti-aliasing low-pass filter to bandlimit the input signal prior to sampling, and a sample-and-hold circuit, which samples the input signal periodically and provides a held output constant between sample times, to the A/D converter. These components are is necessary because these converters produce erroneous results if the input voltage changes during the course of a conversion cycle.

The oversampling A/D converters do not require either of these components and, thus, provide substantial savings in space, power consumption, and cost, which is particularly important for the present invention. The function of the input low-pass filter is replaced by a digital filter, within the oversampling converter, which operates on the oversampled data prior to exiting the A/D converter. The effect of this digital low-pass filter is to provide the same function of anti-aliasing as the external low-pass filter serves in the sucessive approximation system.

The oversampling converter input stage, which is a high speed comparator or a "flash" converter, which is generally 3–6 bits in resolution. Because these types of converter circuits are composed of high speed comparators, they operate continuously and do not require a sampled-and-held input. The instant of sampling is determined within the oversampling converter by a digital latch on the data coming out of the compartor or flash A/D. This internal latch replaces the function of the external sample-and-hold.

By using an oversampling A/D converter, the overall volume, complexity, cost, and power consumption of the system is greatly reduced, to the point where a hand-held, lightweight conversion system becomes practical. Additional savings are realized in the elimination of the low-pass filter and sample-and-hold circuits.

DESCRIPTION OF FIG. 1

An audio bandwidth analog input signal 100 is applied to an input 102 of an analog-to-digital (A/D) converter, 104, which changes the analog information into digital form. A/D converter 104 takes a "snapshot" or sample of the input voltage at a particular time instant and changes the analog voltage into a digital representation using techniques well known to those of skill in the art. The instant of sampling is defined by an edge of the digital signal applied to line 105, called the sample command. This can be generated periodically by an oscillator, such as a quartz crystal, with a stable period and a fast rising pulse or squarewave output. By sampling at uniform time instants, it an by shown that a complete representation of the signal will be obtained if the sampling frequency is at least twice the signal bandwidth. See, eg., op. cit., Mischa Schwartz, "Information Transmission, Modulation and Noise." For example, with an input signal of bandwidth B Hertz, the Nyquist sampling rate is 2 B Hertz, and this would by the minimum sampling frequency for the A/D conversion process.

The preferred embodiment of the real-time analyzer uses an oversamping A/D converter 104. This provides low power consumption, high speed, and high resolution in a single integrated circuit chip. These converters also provide an inherent anti-aliasing filter and sample-and-hold capability, thus eliminating the need for these external discrete circuits. Note that no separate sample-and-hold or low-pass filter are indicated in the figures, although they would be neccessary if a non-oversampling A/D converter were used for 104.

Commerically available integrated circuits, such as the Crystal Semiconductor part number CS-5326 or the Motorola DSP56ADC16, include all of these functions within a single package in the dimensions of an industry standard, 28-pin or 16-pin, dual-in-line package.

The self-contained analyzer is made realizable by the use of these oversampling integrated circuits because other A/D converter techniques providing high resolution (16 bit) conversion at audio frequencies consume so much power and space that they cannot fit into a hand-held portable instrument. especially those The digital output 106 of A/D converter 104 is applied to a digital signal processor integrated circuit 108. The so called "real-time" operation on the analyzer is critical in many applications. The speed of the digital signal processing (DSP) program will be a trade off between the processing power of the DSP integrated circuit, the bandwidth of the input signal, and the resolution of the frequency spectrum, which is the result. The prior art systems were incapable of providing high resolution real-time analysis in a hand-held package. So called ⅓ octave analyzers provide a constant bandwidth analysis useful mainly for room equalization. However, these devices are incapable of providing a high resolution constant resolution analysis.

The capabilities of the system described herein are limited only by the analysis speed of the digital signal processor integrated circuit. For example, commercially available units such as the Texas Instruments TMS320C25 or Motorola DSP56001 operate at such a high rate of computation speed that they are capable of computing 1024 point, 20 kHz spectra in real-time.

This digital signal processor is controlled by a stored program, unit 112, which is, in turn, controlled by a digital signal processor program with a set of spectrum analysis processing programs, unit 116. Unit 112 contains the stored programs. Digital signal processor 108 selects and controls a program in unit 116 and unit 112, under control of a manual control panel 118. Processor 108 receives data 106 in real-time from A/D converter 104 and performs various computations, continuously outputting results 122 in real-time.

Processor 108 is controlled by the user through manual controls 118 via lines 120. The user can change the type of analysis, frequency range and resolution, amplitude scale and various other functions by manipulating manual controls 118.

The output of processor 108 is a serial or parallel stream of digital data 122. This may be directly utilized by an external computer or other digital device via output connection 140. The preferred embodiment of the invention uses one or more digital-to-analog (D/A) converters 124 connected ot output 122 of processor 108. D/A converters 124 change digital information 122 to analog form at outputs 126 using techniques that are well known to those skilled in the data conversion art. Outputs 126 are applied to connectors 128. The user may then observe the results of the analysis on an oscilloscope or other external indicating device. Processor 108 will generally provide several channels of output 122. The data may be simultaneously available in parallel form, or may be alternately outputted via time multiplexing techniques on a single serial channel.

One use of the several outputs is to use one channel to represent the frequency axis and the other channel to represent the amplitude axis of the analysis. By connecting these channels to an external X/Y oscilloscope, a frequency spectrum is displayed. Alternatively, one channel could provide a synchronization signal and the external oscilloscope could then operate in a time base mode, triggering from one channel and observing the amplitude on the other channel.

Another application of these multiple D/A channels is to provide dual output functions, which have two simultaneous output channels of amplitude. For example, one channel could represent phase and the other one magnitude. Alternatively, more than one input channel 100 and A/D converter 104 could be connected to processor 108, thereby providing a dual-channel input function. In this embodiment, two simultaneous analysis could be performed by processor 108 and outputted on two analog channels via D/A converters 124 and output connectors 128. Cross spectra and coherence functions are examples of dual channel functions which can by implemented in software, using the same hardware. These are well known techniques.

The real-time spectrum analyzer is completed by adding a power source 132, which could be a recargeable battery pack, regular batteries, such as lithium or alkaline batteries, or other self-contained power sources. The power source could also be a power supply operated from the power line, such as a plug-in transformer type. The power source generally will provide a single voltage, which varies somewhat with the state of the battery charge. The output of power source 134 goes to a power supply 136, which takes the variable voltage basic power source and converts it to regulated fixed voltages of various magnitude and polarities 138, which are required by the other parts of the analyzer.

Power supply 136 may be an inverter, rectifier, filter capacitor, and linear regulator type, or various pulse width modulated switched mode power supply techniques may be used. These devices are available as commercial modules from various manufacturers or may be custom designed for the application, using techniques well known to those skilled in the power supply art.

The combination of a self-contained power supply, oversampling A/D converter, real-time digital signal processor integrated circuit, FFT spectrum analysis programs and digital-to-analog converters provide a complete signal processing system in a hand-held miniature package.

DESCRIPTION OF FIG. 2

FIG. 2 includes all of the components of the already described self-contained real-time spectrum analyzer, but also includes the feature of a continuously variable analysis bandwidth. This function is extremely valuable, since it allows the analyzer to zoom in on a particular frequency range of interest. For example, in the study of speech, it may be desirable to observe only the low frequency components below, say, 500 Hz in order to accurately ascertain pitch. One could then increase the analyzer bandwidth and analyze with 3 kHz bandwidth to see the format structure of the speech. By using the full audio bandwidth of 20 kHz, high frequency components, such as silibants and fricatives, may be observed.

The prior art analyzers had the limitation of requiring a different anti-aliasing filter for each frequency range. In addition, many of the A/D converter and sample-and-hold techniques had a limited range of frequencies over which they would provide high performance. The use of an oversampling A/D 104 eliminates all of these problems.

Variable frequency oscillator (VFO) 200 controlled by a frequency control signal 204. The frequency control signal is a DC voltage or current whose magnitude proportionally controls the frequency of output 202 of the VFO 200.

The preferred embodiment utilizes an oversampling A/D converter 104. This type of converter includes a clock input, which determines the sample frequency of the A/D converter, the sample instant of the internal sample-and-hold, and the bandwidth of the digital anti-aliasing filter, all of which are included in the A/D converter integrated circuit. By varying the master clock frequency to the A/D converter, the bandwidth of the internal digital filter is adjusted automatically to be one-half that of the sample frequency, thus, automatically and continuously satisfying the Nyquist criteria as described in the reference Schwartz, op. cit.

This means that a variable frequency spectrum analysis may be obtained for any desired bandwidth within a wide range, merely by selected the master clock frequency. The necessity for a bank of anti-aliasing filters is thereby eliminated.

Variable frequency oscillator techniques are common in the art of analog design. Variable frequency output 202 is applied to a sample command intput 105 of A/D converter 104. This allows the sample rate of the input signal and, hence, the bandwidth and resolution of the subsequent signal analysis to be continuously varied.

In a model of the invention, a continuous frequency range from 100 Hz to 50 kHz has been analyzed in real-time at resolutions of 512 and 1024 points, using the Motorola DSP56001 digital signal processor for block 108 and the Motorola ADSP16 oversampling A/D converter for block 104.

A DC frequency control 204 input to oscillator 200 may be obtained from a manual control, such as a potentiometer, for block 212 or from an external input 208. A tachometer could be used to provide this external input 208 so that the frequency bandwidth of the analyzer tracks some external event, such as the speed of rotation of a piece of machinery whose vibration is to be analyzed. A switch 206 is used to select either of these inputs.

Alternatively, A/D sample command 105 can come directly from an external frequency source, which could also be from a rotating shaft via the use of a magnetic switch or contact. The sampling frequency could be generated using frequency multiplication techniques, such as phase lock loops, which are well known to those skilled in the art.

Sampling frequency 105 may also by automatically controlled by digital signal processor 108 so as to adapt to a changing signal situation. This may be highly useful in certain types of analysis, such as speech, acoustics, underwater sound, or analysis of intelligence information, which is rapidly changing its spectral bandwidth. In also allows synchronization to an external varying clock, such as the output of a tachometer on the shaft of a machine being analyzed.

DESCRIPTION OF FIG. 3

The analog or digital output of the embodiment of FIG. 1 and 2 requires an external device to provide a display or to utilize the information. In many applications, the sole use will be to provide a graphic display so that the user can immediately ascertain the spectrum. In this case, a self-contained display capability can be added to the digital signal analyzer within the scope of the current invention.

This system is shown in FIG. 3, which includes the previous system. However, the output of digital signal processor 108 on lines 122 now enters a display register and driver 300. This is an integrated circuit or other type of circuit that provides the storage capability for an entire screen of information in the form of a matrix or "bit mapped" display. The organization of an internal random access memory (RAM) is an image of an X/Y matrix display. The output of the digital signal processor 108 now includes a frame synchronization signal, which indicates the beginning of a new set of spectra. Generally this signal will begin at the zero frequency or DC line of the spectrum.

Display register and driver 300 will begin to sequentially fill in RAM memory locations with the spectral data, starting with the zero (DC) spectrum line. Display register and driver 300 includes circuitry that provides a row and column scanning of the RAM and level shifting, which can operate a visual display 304 via lines 302. Commercially available products can perform these functions, such as the Densitron LM656 display controller. Display 304 can be an electroluminescent or light emitting diode (LED) dot matrix or in the preferred embodiment, it can be a liquid crystal device (LCD) matrix display.

The LCD uses very low power and can present graphic information at high resolution. For example, a commercially available display panel from Toshiba provides 640×400 point resolution. The hand-held embodiment of the invention could use a somewhat smaller display of, say, 128×128 or 128×256 pixel. The liquid crystal display uses a flat panel of specially prepared chemicals sandwiched between glass or plastic with a matrix of transparent electrodes deposited on it. By putting appropriate voltages on these electrodes, a point on the X/Y display may be made opaque or transparent. By rapidly scanning the display and energizing various X/Y locations, a graphic visual display may be obtained. The flat panel liquid crystal device is driven by a display register and driver 300, specially designed for the particular LCD 304.

FIG. 3 shows typical types of programs that can be used for the digital signal processor. Stored program 112 will access a fast-Fourier transform 306, which provides the basic spectrum analysis function. The spectrum from an FFT will include certain undersirable artifacts, such as side lobes. These are due to sharp edges in the block of data analyzed and may be greatly reduced by the application of a "windowing" function using techniques well known to those of skill in the digital signal processing field. The windowing multiplies the input signal by a function, such as a raised cosine, which is stored as a set of points in a look-up table. This windowing program is shown as 310 in FIG. 3 and is also accessed by stored program 112.

The output of a fast Fourier transform is real and imaginary linear amplitude components. Input signals to system 100 may occupy a very wide dynamic range. In this case, a display of the log of the magnitude of the real and imaginary component provides a better indication, especially for wide dynamic range amplitudes.

The inclusion of a log power spectral density program 314 solves this problem. This program takes the raw FFT data from the FFT program 306, which is complex points (real and imaginary pairs) and first performs a square root of the sum of the squares operation to obtain an magnitude. By taking the logarithm of this magnitude, an output presentation directly in the form of decibels may be obtained. The scale of the presentation on visual display 304 can be controlled by manual controls 118. Window function 310 may also be manually controlled in order to allow the user to vary trade off between side lobe suppression and analysis resolution.

SUMMARY, RAMIFICATIONS AND SCOPE

The reader will thus see that we have provided a self-contained real-time spectrum analyzer capable of providing high resolution frequency spectra of audio bandwidth analog signals. It is self-contained, battery-operated, and hand-held. Its analysis bandwidth and resolution are continuously variable over a wide range of frequencies through the manipulation of a single control. Also, it has a variable frequency capability, which may be controlled by an external input, such as that derived from a tachometer. It includes a flat screen visual display in a hand-held package or a digital output suitable for interfacing to a computer. It includes a window algorithm, a log power spectral density program, and a fast-Fourier transform program. Its power source and power supply are self-contained within a hand-held package. Its analog-to-digital conversion process utilizes an oversampling A/D converter so as to achieve smaller size and weight by eliminating a separate input anti-aliasing low-pass filter and sample-and-hold circuit. It provides analysis of a plurality of channels simiultaneously.

Although we have described our invention be reference to particular illustrative embodiments thereof, many changes and modifications of the invention may become apparent to those skilled in the art without departing from the spirit and scope of the invention. For example, we have show the use of a variable frequency oscillator (VFO) to generate the sample command. A programmable timer, driven by a fixed frequency oscillator, with a division ratio controlled by the digital signal processor or another processing unit could be used, as well.

Therefore, the full scope of the invention should be determined by the appended claims and their legal equivalents, and not by the examples given.

We claim:

1. A self-contained, real-time spectrum analyzer, comprising:
    (a) input means for accepting an externally applied electrical signal,
    (b) analog-to-digital converter means for sampling said externally applied electrical signal at said input means at periodic time intervals and for providing a digital representation of said externally applied input signal at said periodic time intervals,
    (c) digital signal processor means having an input port and an output port, said input port connected to receive said digital representation of said externally applied input signal from said analog-to-digital converter means, said digital signal processor means arranged to process said digital representation and supply the results of said process to said output port, said digital signal process or means comprising means for providing real-time resolution of said digital representation of said externally applied input signal into an array of coefficients in a frequency domain, said coefficients representing a frequency spectrum of said time-varying digital signal.
    (d) a display interface connected to said output port of said digital signal processor means for converting said results of said process into electrical signals of magnitude and waveshape suitable for driving a display, and
    (e) display means connected to said display interface for providing a graphic display of said frequency spectrum, whereby the frequency spectrum of said externally applied electrical signal will be computed and displayed in real-time on said display means.

2. The self-contained real-time spectrum analyzer described in claim 1, further including a variable frequency digital clock generator wherein a sampling frequency of said analog-to-digital converter is determined by a digital clock generated by said variable frequency digital clock generator and wherein a bandwidth of said frequency spectrum is proportional to the sampling frequency of said analog-to-digital converter means, whereby the bandwidth of said frequency spectrum is controlled by said variable frequency digital clock generator.

3. The self-contained real-time spectrum analyzer of claim 1 wherein said display means is an oscilloscope and said display interface is a digital-to-analog converter.

4. The self-contained real-time spectrum analyzer of claim 1 wherein said digital signal processor is arranged to provide a real-time resolution of said time-varying digital signal into an array of coefficients in the frequency domain by use of a fast Fourier transform.

5. The self-contained real-time spectrum analyzer of claim 1 wherein said real-time resolution of a time-varying digital signal into an array of coefficients in the frequency domain is computed at a speed equal to or faster than the speed at which said output port contains all of the information which is present in said externally applied electrical signal, up to said cutoff frequency of said finite impulse response low-pass digital filter.

6. The self-contained real-time spectrum analyzer of claim 1 wherein said analog-to-digital converter means and said digital signal processor means are included within a signal integrated circuit.

7. A self-contained, real-time spectrum analyzer, comprising:
(a) input means for accepting externally applied electrical signals,
(b) a periodic time interval generator for generation of a periodic time interval output whose period is determined by a control,
(c) analog-to-digital converter means for sampling said externally applied electrical signals at said input means at said periodic time intervals determined by said periodic time interval generator, and for providing a digital representation of said externally applied electrical signals at said periodic time intervals.
(d) digital signal processor means having an input port, and an output port, said input port arranged to receive said digital representation of said externally applied electrical signals from said analog-to-digital converter, said digital signal processor arranged to process in real-time said digital representation and to supply the results of said process to said output port, said digital signal processor means comprising means for providing a resolution of time periodic digital signals at said input port into an array of coefficients in a frequency domain, said coefficients representing the Fourier transform of said time periodic digital signals,
(e) a window program with an input means and an output means, said input means connected to receive said digital representation of said externally applied electrical signals, said output means consisting of the multiplication of said input by a stored table of numerical coefficients in time sequence for providing a windowed data output,
(f) a fast-Fourier transform program for computing frequency spectra, with an input and an output, whose input is said window program, and whose output is a Fourier transform of said input, said output comprising said array of coefficients in said frequency domain, each of said coefficients having a real component and an imaginary component,
(g) a logarithm power spectral density program with an input and and output, whose input is said real component and said imaginary component of each of said coefficients, whose output comprises the computation of a sum of a square of said real component and a square of said imaginary component of each said coefficients, arranged to compute a logarithm of said sum for each of said coefficients,
(h) a digital-to-analog converter having an input connected to said output port of said digital signal processor means, and an output for providing an analog output signal whose magnitude is proportional to the digital signal at said output port of said digital signal processor means,
whereby the frequency spectra of said externally applied electrical signals are computed continuously in real-time and provided in analog form at said output of said digital-to-analog converter.

8. The self-contained real-time spectrum analyzer of claim 7 wherein said analog-to-digital converter means is an oversampling analog-to digital converter.

9. The self-contained real-time spectrum analyzer of claim 7 wherein said digital-to-analog converter means is an oversampling digital-to-analog converter.

10. The self-contained real-time spectrum analyzer of claim 7 wherein said analog-to-digital converter means includes a finite impulse response low-pass digital filter with a cutoff frequency less than or equal to one-half the inverse of said periodic time interval.

11. The self-contained real-time spectrum analyzer of claim 7 further including a self-contained power source with at least one output connected to said digital signal processor means and with at least one power output connected to said display interface for providing a self-contained source of electrical operating power.

12. The self-contained real-time spectrum analyzer of claim 7 further including at least one digital-to-analog converter having digital inputs connected to said output port of said digital signal processor means, each of said digital-to-analog converters providing an analog output signal whose magnitude is proportional to a value present at said output port of said digital signal processor means, whereby the frequency spectrum of each of externally applied electrical signals is computed in real-time provided in analog form by each of said analog output signals of said digital-to-analog converters.

13. The self-contained real-time spectrum analyzer of claim 7, further including a plurality of digital-to analog converters connected to said output port of said digital signal processor means, and a program for signal generation connected to said digital signal processor means, whereby a digital signal may be generated in said digital signal processor, outputted in analog form to an external system, so that an output of said external system can be applied to said intput port for analysis.

14. A self-contained, real-time spectrum analyzer, comprising:
(a) input means for accepting externally applied electrical signals,
(b) a periodic time interval generator arranged to supply a predetermined output at periodic time intervals, said generator including a manual control for determining the period of said output intervals.
(c) oversampling analog-to-digital converter means for sampling said externally applied electrical signals at said input means at siad periodic time intervals, and for providing a digital representation of said externally applied input signals at said periodic time intervals, and for frequency bandlimiting said digital representation of said externally applied input signals,
(d) digital signal processor means having an input port and and output port, said input port arranged to receive said digital representation of said externally applied electrical signals from said analog-to-digital converter, said digital signal processor arranged to process in real-time said digital representation and to supply the results of said process to said output port, said digital signal processor means comprising means for providing a resolution of time periodic digital signals into an array of coefficients in a frequency domain, representing the Fourier transform of said time periodic digital signals, (e) a digital-to-analog converter having an input connected to said output port of said digital signal processor means, and an output for providing an analog signal whose amplitude is proportional to a numerical value of a digital signal at said output port of said digital signal processor means, whereby frequency spectra of said externally applied electrical signals are computed in real-time and provided in analog form at said analog output of said digital-to-analog converter.

15. The self-contained real-time spectrum analyzer of claim 14 wherein said analog-to-digital converter means is an integrated circuit including a sample-and-hold function and a digital low-pass filter.

16. The self-contained real-time spectrum analyzer of claim 14 wherein said analog-to-digital converter means includes a finite impulse response low-pass digital filter with a cutoff frequency equal to or less than one-half the inverse of said periodic time interval.

17. The self-contained real-time spectrum analyzer of claim 14, further including at least a second input means connected to at least a second analog-to-digital converter means, whereby real-time frequency spectra of a plurality of externally applied electrical signals are continuously computed.

18. The self-contained real-time spectrum analyzer of claim 14 wherein said process or means for providing a resolution of time periodic digital signals into an array of coeffiencts in the frequency domain includes a constant percent bandwidth spectrum analysis program.

19. The selft-contained real-time spectrum analyzer of claim 1, further including a variable frequency digital clock generator in which said periodic time interval is determined by said variable frequency digital clock generator and wherein the frequency bandwidth of said real-time frequency spectra is inversely proportional to said periodic time interval, whereby siad frequency bandwidth of said real-time frequency spectra is controlled by said variable frequency digital clock generator.

20. The self-contained real-time spectrum analyzer of claim 1 wherein said analog-to-digital converter means is an oversampling analog-to-digital converter.

* * * * *